(12) United States Patent
Clara et al.

(10) Patent No.: US 12,132,457 B2
(45) Date of Patent: Oct. 29, 2024

(54) BUFFER CIRCUIT, RECEIVER, BASE STATION AND MOBILE DEVICE

(71) Applicant: Intel Corporation, Santa Clara, CA (US)

(72) Inventors: Martin Clara, Santa Clara, CA (US); Giacomo Cascio, Villach (AT)

(73) Assignee: Intel Corporation, Santa Clara, CA (US)

( * ) Notice: Subject to any disclaimer, the term of this patent is extended or adjusted under 35 U.S.C. 154(b) by 795 days.

(21) Appl. No.: 17/131,824

(22) Filed: Dec. 23, 2020

(65) Prior Publication Data

US 2022/0200554 A1 Jun. 23, 2022

(51) Int. Cl.
*H03F 3/45* (2006.01)
*H03F 1/30* (2006.01)

(52) U.S. Cl.
CPC ......... *H03F 3/45192* (2013.01); *H03F 1/303* (2013.01); *H03F 2200/153* (2013.01)

(58) Field of Classification Search
CPC ................. H03F 3/45192; H03F 1/303; H03F 2200/153; H03F 3/45475; H03F 3/19;
(Continued)

(56) References Cited

U.S. PATENT DOCUMENTS 9,461,625 B1 * 10/2016 Prandi .................. H03H 19/004
2004/0242177 A1 * 12/2004 Yang ..................... H04W 52/52
455/234.1

(Continued)

OTHER PUBLICATIONS

Ku Yi-Tsen et al: "A new current-mode wheatstone bridge based on a new fully differential operational transresistance amplifier", AEU—International Journal of Electronics and Communications, vol. 101, Feb. 4, 2019 (Feb. 4, 2019), pp. 85-92, XP085621285, ISSN: 1434-8411, DOI: 10.1016/J.AEUE.2019.01.032, p. 87, right-hand column, paragraph 2, p. 88, left-hand column, paragraph 1-3, p. 88, right-hand column, last paragraph—p. 89, left-hand column, paragraph 1, figures 3,4,8.

(Continued)

*Primary Examiner* — Andrea Lindgren Baltzell
*Assistant Examiner* — Khiem D Nguyen
(74) *Attorney, Agent, or Firm* — 2SPL Patent Attorneys PartG mbB; Yong Beom Hwang

(57) ABSTRACT

A buffer circuit is provided. The buffer circuit includes a Current Differencing Transconductance Amplifier (CDTA) comprising a first input node and a second input node each configured to receive a respective one of a first signal and a second signal. The buffer circuit further includes a first source follower circuit coupled to a first output node of the CDTA and configured to generate a first buffer output signal based on a first output signal of the CDTA. Additionally, the buffer circuit includes a second source follower circuit coupled to a second output node of the CDTA and configured to generate a second buffer output signal based on a second output signal of the CDTA. The buffer circuit further includes a first feedback path comprising at least one of a first resistive element and a first capacitive element. The first feedback path couples an output node of the first source follower circuit to the first input node of the CDTA. In addition, the buffer circuit includes a second feedback path comprising at least one of a second resistive element and a second capacitive element. The second feedback path couples an output node of the second source follower circuit to the second input node of the CDTA.

25 Claims, 10 Drawing Sheets

(58) Field of Classification Search
CPC .. H03F 1/083; H03F 1/34; H03F 1/42; H03M 1/122; H03M 1/124; H03M 1/1245; H03M 1/121; H04B 1/16; H04W 88/08
USPC .......................................................... 330/253
See application file for complete search history.

(56) References Cited

U.S. PATENT DOCUMENTS

2005/0270099 A1* 12/2005 Stoger ................. H03F 3/45183
330/253
2009/0039961 A1 12/2009 Damitio

OTHER PUBLICATIONS

Biolek Dalibor: "CDTA—Building Block 1 for Current-Mode Analog Signal Processing", Proceedings of the European conference on circuit theory and design 2003—ECCTD'03, Jan. 2003 (Jan. 2003), pp. 397-400, XP055914047, Krakow Retrieved from the Internet: URL: https//user.unob.cz/biolek/veda/articles/ECCTD03_2.pdf [retrieved on Apr. 20, 2022 * Equation (1); figures 1,2 *.

Biolek D et al: "Modified buffered transconductance amplifier for analog signal processing", Radioelektronika, 2009 . Radioelektronika '09. 19th International Conference, IEEE, Piscataway, NJ, USA, Apr. 22, 2009 (Apr. 22, 2009), pp. 191-194, XP031485797, ISBN: 978-1-4244-3537-1 * figure 2 *.

Carlos Sanchez-Lopez: "Pathological Equivalents of Fully—Differential Active Devices for Symbolic Nodal Analysis", IEEE Transactions on Circuits and Systems I: Regular Papers, IEEE, US, vol. 60, No. 3, Mar. 1, 2013 (Mar. 1, 2013), pp. 603-615, XP011495089, ISSN: 1549-8328, DOI: 10.1109/TCSI.2013.2244271 * the whole document *.

Elliot Rod: "Follow the leader—Voltage Followers & Buffers", Jul. 2016 (Jul. 2016), XP055914609, Retrieved from the Internet: URL: https://sound-au.com/articles/followers.html [retrieved on Apr. 21, 2022] * figures 10,13 *.

J. Kim, S. Hoyos, J. Silva-Martinez: "Wideband Common-Gate CMOS LNA Employing Dual Negative Feedback With Simultaneous Noise, Gain, and Bandwidth Optimization," IEEE Trans. on Micro. Theory and Techn., vol. 58, No. 9, pp. 2340-2351, Sep. 2010.

H. Zhang, X. Yan et al., "A 0.5-5.6 GHZ Inductorless Wideband LNA with Local Active Feedback," in IEEE 3rd Inter. Confe. on Integ. Circuits and Micro. (ICICM), Dec. 2018, pp. 24-26.

G. Palumbo, S. Pennisi: "Current-feedback amplifiers versus voltagen operational amplifiers," IEEE Trans. Circuits Syst. I, Fundam. Theory Appl., vol. 48, No. 5, pp. 617-623, May 2001.

G. Palmisano, G. Palumbo, R. Salerno: "A 1.5-V high drive capability CMOS op-amp," IEEE J. Solid-State Circuits, vol. 34, No. 2, pp. 248-252, Feb. 1999.

* cited by examiner

BUFFER CIRCUIT, RECEIVER, BASE STATION AND MOBILE DEVICE

FIELD

The present disclosure relates to input buffering for Analog-to-Digital Converters (ADCs). In particular, examples relate to a buffer circuit, a receiver comprising the buffer circuit, a base station comprising the receiver and a mobile device comprising the receiver.

BACKGROUND

In modern high-speed ADCs, the input signal sampling process plays a crucial role. Limitations of the sampling process and the optimization of the function defines the overall system performance. For example, in a multi-Giga-sample per second time-interleaved ADC, the timing resolution requirement is sub-picosecond, and the slew-rate and bandwidth limitations of each Radio Frequency (RF) buffer pose a serious obstacle to fulfil gain and timing-skew performance requirements without significantly compromising the power budget.

The time-interleaved ADC is an architecture that cycles through a set of N sub-ADCs such that the aggregate throughput is N times the sample rate of the individual sub-ADCs. In a real physical implementation each sub-ADC has its own offset, gain and timing skew. Further, the signal and clock distributions have differences imposed by the distributed nature of this architecture which can result in time-varying errors degrading ADC performance.

RF buffer limitations when it comes to bandwidth, slew-rate, common-mode rejection or reverse isolation set the barrier for the overall system and in general for RF transceiver performance.

Hence, there may be a desire for an improved buffer.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
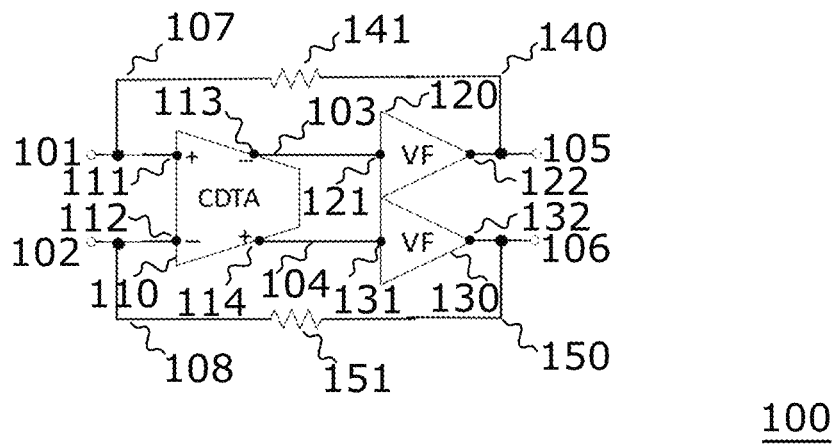
FIG. 1 illustrates a first example of a buffer circuit.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "of", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates an example of a buffer circuit 100. The buffer circuit 100 comprises a Current Differencing Transconductance Amplifier (CDTA) 110. The CDTA 110 comprises a first input node 111 and a second input node 112 each configured to receive a respective one of a first signal 101 and a second signal 102. For example, the first input node 111 may receive the first signal 101 and the second input node 112 may receive the second signal 102. The first signal 101 and the second signal 102 may form a differential signal pair according to examples of the present disclosure.

As indicated in FIG. 1, the first input node 111 may be a non-inverting input node of the CDTA 110 and the second input node 112 may be an inverting input node of the CDTA 110. However, the present disclosure is not limited thereto. In other examples, the first input node 111 may be an inverting input node of the CDTA 110 and the second input node 112 may be a non-inverting input node of the CDTA 110.

The buffer circuit 100 further comprises a first source follower circuit (common drain amplifier) 120, i.e. a first amplifier in a source follower (common drain) configuration. An input node 121 of the first source follower circuit 120 is coupled to a first output node 113 of the CDTA 110. The first source follower circuit 120 receives a first output signal 103 of the CDTA and is configured to generate a first buffer output signal 105 based on the first output signal 103 of the CDTA 110. The first source follower circuit 120 comprises an output node 122 configured to output the first buffer output signal 105.

The buffer circuit 100 further comprises a second source follower circuit (common drain amplifier) 130, i.e. a second amplifier in a source follower (common drain) configuration. An input node 131 of the second source follower circuit 130 is coupled to a second output node 114 of the CDTA 110. The second source follower circuit 130 receives a second output signal 104 of the CDTA and is configured to generate a second buffer output signal 106 based on the second output signal 104 of the CDTA 110. The second source follower circuit 130 comprises an output node 132 configured to output the second buffer output signal 106.

As indicated in FIG. 1, the first output node 113 may be an inverting output node of the CDTA 110 and the second output node 114 may be a non-inverting output node of the CDTA 110. However, the present disclosure is not limited thereto. In other examples, the first output node 113 may be non-inverting output node of the CDTA 110 and the second output node 114 may be an inverting output node of the CDTA 110.

A first feedback path 140 couples the output node 122 of the first source follower circuit 120 to the first input node 111 of the CDTA 110. Analogously, a second feedback path 150 couples the output node 132 of the second source follower circuit 130 to the second input node 112 of the CDTA 110.

The first feedback path 140 comprises a first resistive element 141 configured to generate a first feedback current 107 based on the first buffer output signal 105. In other examples, the first feedback path 140 may comprise a first capacitive element instead or in addition to the first resistive element 141. The first resistive element 141 may be a single resistor as illustrated in FIG. 1 or comprise a plurality of coupled resistors. For example, the first resistive element 141 may comprise a plurality of switchable resistors such that a resistance of the first resistive element 141 is adjustable by selectively coupling one or more of the plurality of switchable resistors based on one or more control signals. Similarly, the first capacitive element may be a single capacitor or comprise a plurality of coupled capacitors. For example, the first capacitive element may comprise a plurality of switchable capacitors such that a capacitance of the first capacitive element is adjustable by selectively coupling one or more of the plurality of switchable capacitors based on one or more control signals.

Analogously, the second feedback path 150 comprises a second resistive element 151 configured to generate a second feedback current 108 based on the second buffer output signal 106. In other examples, the second feedback path 150 may comprise a second capacitive element instead or in addition to the second resistive element 151. The second resistive element 151 may be formed as described above for the first resistive element 141. Similarly, the second capacitive element may be formed as described above for the first capacitive element.

In the buffer circuit 100, the CDTA 110 is used as input stage followed by two wideband source followers 120, 130 used as output driving stage. The circuit arrangement of the current feedback amplifier structure may allow to maximize the bandwidth of the buffer circuit 100 (e.g. up to several GHz). The buffer circuit 100 may allow to efficiently mitigate bandwidth limitations and encompass sensitivity versus input parasitic capacitances (e.g. RF front-end input parasitic capacitances). The buffer circuit 100 may, e.g., be suitable for use as an RF front-end driving stage for an ADC (e.g. for a respective sub-ADC of a multi-Giga-Sample per second time-interleaved ADC).

The current-feedback design of the buffer circuit 100 may provide a high bandwidth capability so that the buffer circuit 100 may be particularly suitable for RF direct sampling architectures with time-interleaved ADCs. Further, by using the wideband source follower circuits 120 and 130 as output stage, the buffer circuit 100 may provide a high driving capability. The buffer circuit 100 may also exhibit less sensitivity against parasitic capacitances due to its (ultra-)low input and output impedances. The structure of the buffer circuit 100 may further enable a high reverse isolation such that the buffer circuit 100 may allow to minimize loading of an RF driving front-end by, e.g., the sampling activity of an ADC coupled to the output of the buffer circuit 100. The buffer circuit 100 may additionally show a superior robustness against Electrical OverStress (EOS) coming by means of the signals 101 and 102 from external circuitry due to the superior robustness of the CDTA 110 against EOS.

The proposed current-mode feedback buffer architecture uses a transimpedance amplifier or current-conveyor (CCI+) I/V converter which features current feedback rather than the conventional voltage feedback used by conventional operational amplifiers. Therefore, it may be not limited by the conventional gain-bandwidth product of a standard operational amplifiers and may offer a much higher bandwidth, particularly attractive and beneficial in modern RF transceivers.

Figure 2:
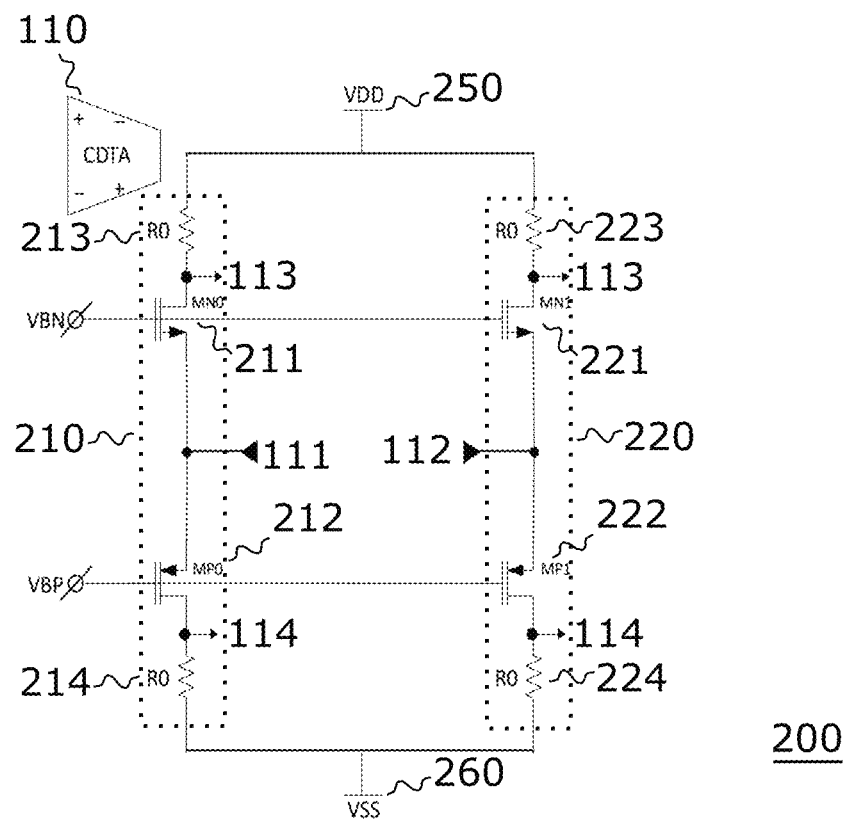
FIG. 2 illustrates a first example of a Current Differencing Transconductance Amplifier (CDTA)

An exemplary CDTA 200 that may be used in a buffer circuit according to the proposed technology is illustrated in FIG. 2. The CDTA 200 comprises two common gate stages (circuits) 210 and 220.

The first common gate stage 210 comprises two transistors 211 and 212 coupled in series between a voltage supply input node 250 configured to receive a voltage supply signal (e.g. a positive supply voltage $V_{DD}$) and a reference supply input node 260 configured to receive a reference supply signal (e.g. a negative supply voltage $V_{SS}$ or ground). The source terminals of the transistor 211 and the transistor 212 are coupled to the first input node 111 of the CDTA 200. The drain terminal of the transistor 211 is coupled to the voltage supply input node 250, and the drain terminal of the transistor 212 is coupled to the reference supply input node 260.

Analogously, the second common gate stage 220 comprises two transistors 221 and 222 coupled in series between the voltage supply input node 250 and the reference supply input node 260. The source terminals of the transistor 221 and the transistor 222 are coupled to the second input node 112 of the CDTA 200. The drain terminal of the transistor 221 is coupled to the voltage supply input node 250 and the drain terminal of the transistor 222 is coupled to the reference supply input node 260.

The transistors 211 and 221 are of a first conductivity type and the transistors 212 and 222 are of a different second conductivity type. In the example of FIG. 2, the transistors 211 and 221 are n-type (n-channel) transistors and the transistors 212 and 222 are p-type (p-channel) transistors. However, the present disclosure is not limited thereto. In other examples, the transistors 211 and 221 may be p-type (p-channel) transistors and the transistors 212 and 222 may be n-type (n-channel) transistors.

The gate terminals of the of the transistors 211 and 221 are configured to receive a first common signal to keep (maintain) the transistors 211 and 221 in a conductive state. Analogously, the gate terminals of the of the transistors 212 and 222 are configured to receive a second common signal to keep (maintain) the transistors 212 and 222 in the conductive state.

A respective resistive element 213, 214, 223, 224 (e.g. a single resistor or a plurality of coupled resistors) is coupled between the drain terminal of each of the transistors 211, 212, 221 and 222 and the respective one of the voltage supply input node 250 and the reference supply input node 260.

The drain terminals of the transistors 211 and 221 are coupled to the first output node 113 of the CDTA and the drain terminals of the transistors 212 and 222 are coupled to the second output node 114 of the CDTA.

The transistors 211, 212, 221 and 222 may, e.g., be thin-oxide devices. As the input nodes 111 and 112 are connected to the source terminals of the transistors 211, 212, 221 and 222, their gate terminals are not directly exposed to external circuitry (e.g. an RF front-end). Accordingly, an intrinsic robustness of the input stage may be increased.

The common gate stage topology illustrated in FIG. 2 may allow to define the input impedance $Z_{in}(f)$ by the equivalent $G_{m_{eq}}$ (parallel of P/NMOS) in open-loop configuration. Further, it may allow to better control the output common-mode voltage. Additionally, it may enable high bandwidth and allow pre-amplification of the differential (e.g. RF) input signal.

The common gate topology offers a current driven input with very low open-loop input impedance. This may be particularly attractive for high bandwidth requirements such as, e.g., RF front-ends.

Figure 3:
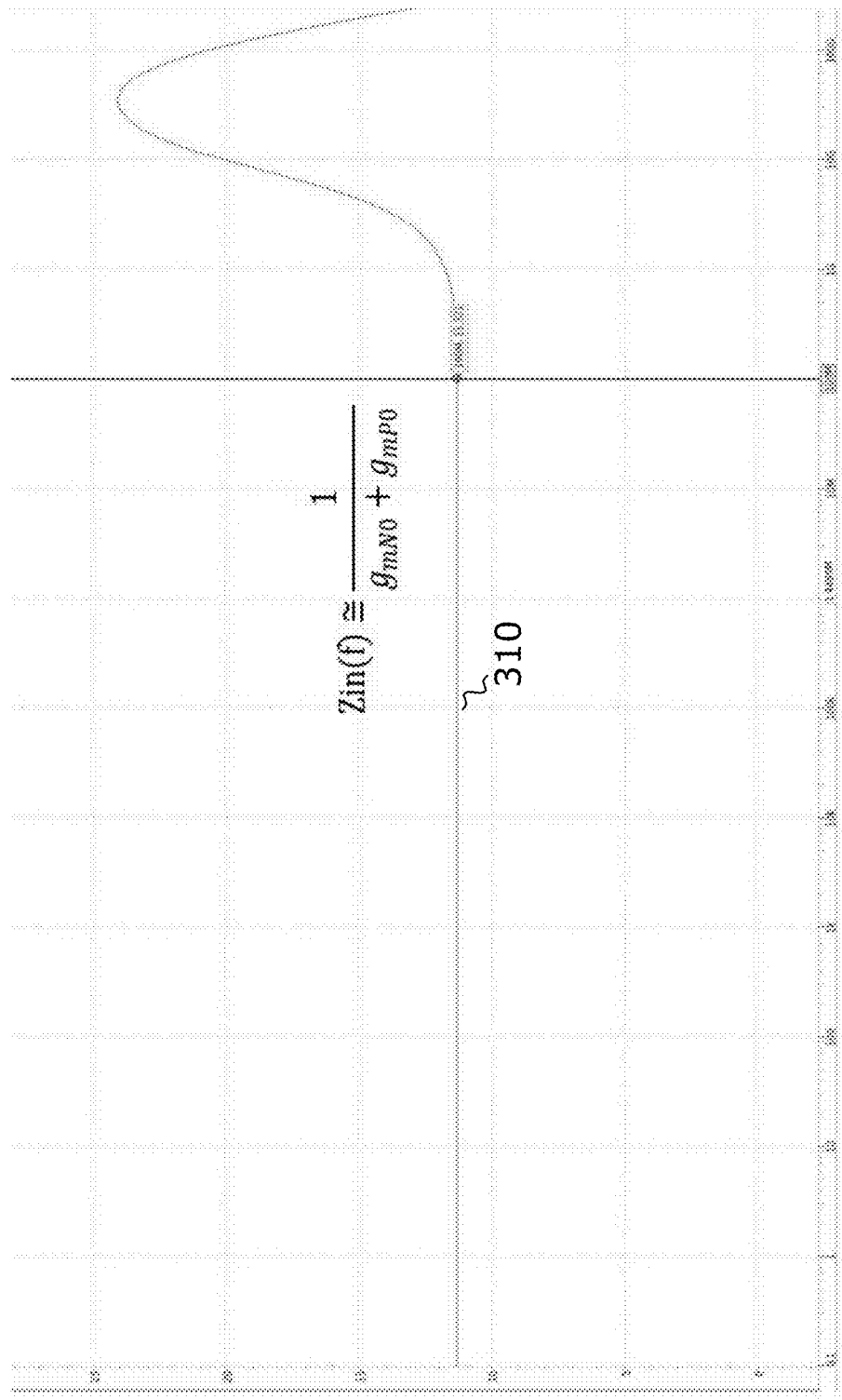
FIG. 3 illustrates an example of a transfer function of a CDTA.

An exemplary course 310 of the open-loop input impedance over frequency of a common-gate stage such as the common gate stages 210 and 220 is illustrated in FIG. 3.

The class AB input stage (common-gate) of the CDTA may offer superior robustness, a high level of symmetry without deteriorating the bandwidth as well as an intrinsic (open-loop) low input impedance making it less sensitive to inevitable parasitic capacitances (e.g. due to layout).

The closed-loop input impedance of a buffer circuit according to the proposed technology may be made even more low ohmic thanks to the feedback path. This can be seen from the following mathematical expression:

$$Z_{in_{CLOSED-LOOP}}(f) = \frac{Z_{in_{OPEN-LOOP}}(f)}{1 + A_{OL}(f) \cdot \beta(f)} \quad (1)$$

Figure 4:
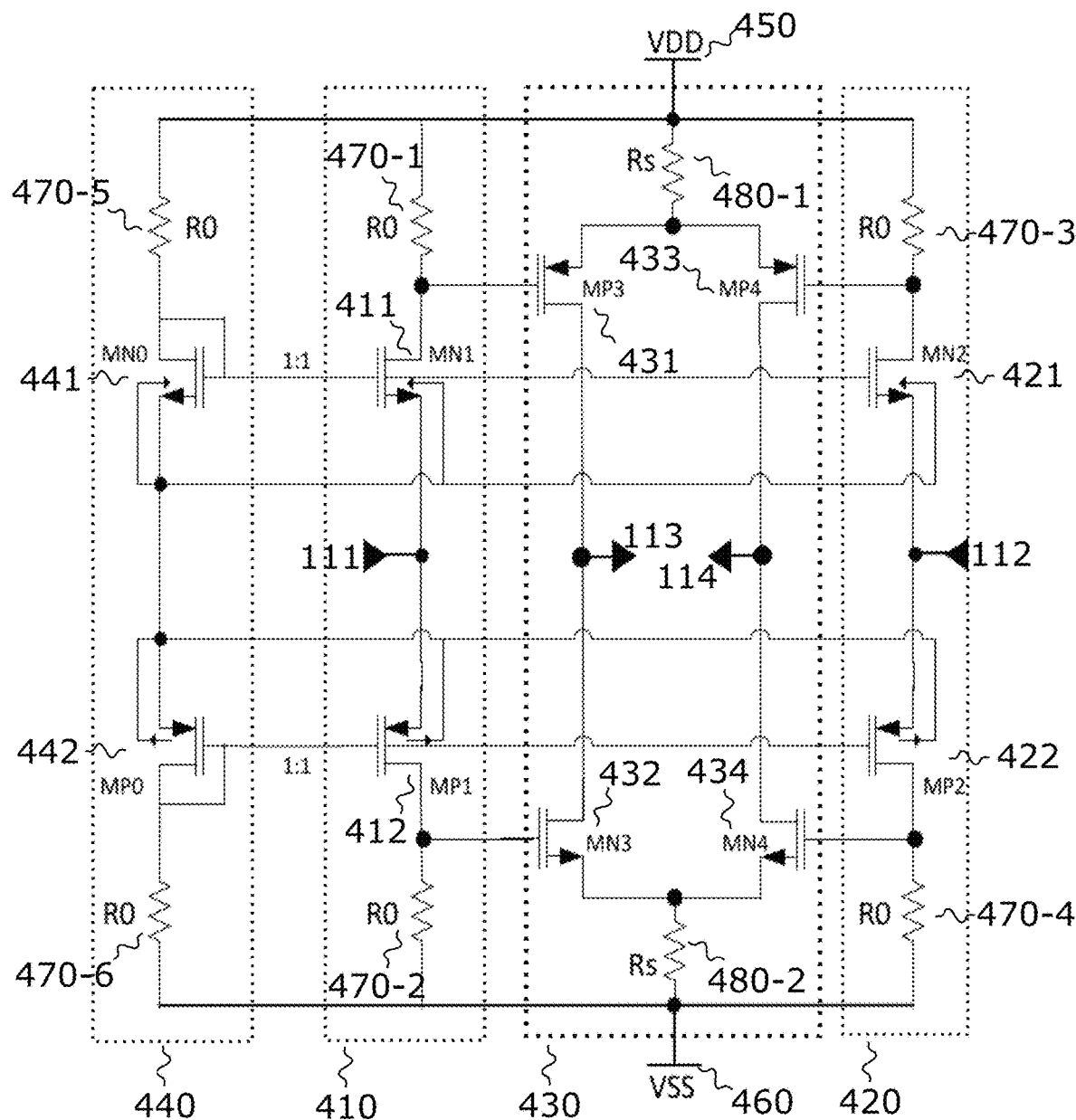
FIG. 4 illustrates a second example of a CDTA.

Another exemplary CDTA 400 that may be used in a buffer circuit according to the proposed technology is illustrated in FIG. 4. The CDTA 400 comprises a voltage supply input node 450 configured to receive a voltage supply signal (e.g. a positive supply voltage $V_{DD}$). Further, the CDTA 400 comprises a reference supply input node 460 configured to receive a reference supply signal (e.g. a negative supply voltage $V_{SS}$ or ground).

A first path 410, a second path 420, a third path 430 and biasing circuitry 440 are coupled in parallel between the voltage supply input node 450 and the reference supply input node 460. The first path 410 and the second path 420 are two common gate stages similar to what is described above with respect to FIG. 3. The third path is a common source stage.

The first path 410 comprises a transistor 411 and a transistor 412. The source terminals of the transistor 411 and the transistor 412 are coupled to the first input node 111 of the CDTA 400. The drain terminal of the transistor 411 is coupled to the voltage supply input node 450. The drain terminal of the transistor 412 is coupled to the reference supply input node 460.

The second path 420 comprises a transistor 421 and a transistor 422. The source terminals of the transistor 421 and the transistor 422 are coupled to the second input node 112 of the CDTA 400. The drain terminal of the transistor 421 is coupled to the voltage supply input node 450. The drain terminal of the transistor 422 is coupled to the reference supply input node 460.

The third path comprises a transistor 431 and a transistor 432 coupled in series. Further, the third path comprises a transistor 433 and a transistor 434 coupled in series. The transistors 431 and 432 are coupled in parallel to the transistors 433 and 434.

The drain terminals of the transistor 431 and the transistor 432 are coupled to the first output node 113 of the CDTA 400. The drain terminals of the transistor 433 and the transistor 434 are coupled to the second output node 114 of the CDTA 400.

The gate terminal of the transistor 431 is coupled to the drain terminal of the transistor 411. The gate terminal of the transistor 432 is coupled to the drain terminal of the transistor 412. Analogously, the gate terminal of the transistor 433 is coupled to the drain terminal of the transistor 421, and the gate terminal of the transistor 434 is coupled to the drain terminal of the transistor 422.

The source terminal of the transistor 431 is coupled to the voltage supply input node 450. The source terminal of the transistor 432 is coupled to the reference supply input node 460. Analogously, the source terminal of the transistor 433 is coupled to the voltage supply input node 450, and the source terminal of the transistor 434 is coupled to the reference supply input node 460.

The biasing circuitry 440 is configured to supply a first bias signal to the gate terminals of the transistor 411 and the third transistor 421. Further, the biasing circuitry 440 is configured to supply a second bias signal to the gate terminals of the transistor 412 and the transistor 422. Accordingly, the transistors 411, 412, 421 and 422 may be kept in a conductive state.

The biasing circuitry 440 of the CDTA 400 comprises a transistor 441 and a transistor 442 coupled in series. In particular, the source terminals of the transistor 441 and the transistor 442 are coupled in series. The drain terminal of the transistor 441 is coupled to the voltage supply input node 450 and the gate terminal of the transistor 441. The drain terminal of the transistor 442 is coupled to the reference supply input node 460 and the gate terminal of the transistor 442. The gate terminal of the transistor 441 is coupled to the gate terminals of the transistor 411 and the transistor 421. The gate terminal of the transistor 442 is coupled to the gate terminals of the transistor 412 and the transistor 422.

The bulk terminals of the transistor 411, the transistor 421 and the transistor 441 are coupled with each other. Further, the bulk terminals of the transistor 411, the transistor 421 and the transistor 441 are coupled with the source terminal of the transistor 441. Analogously, the bulk terminals of the transistor 412, the transistor 422 and the transistor 442 are coupled with each other. Further, the bulk terminals of the transistor 412, the transistor 422 and the transistor 442 are coupled with the source terminal of the transistor 442.

The transistors 411, 421, 432, 434 and 441 are of a first conductivity type and the transistors 412, 422, 431, 433 and 442 are of a different second conductivity type. In the example of FIG. 4, the transistors 411, 421, 432, 434 and 441 are n-type (n-channel) transistors and the transistors 412, 422, 431, 433 and 442 are p-type (p-channel) transistors. However, the present disclosure is not limited thereto. In other examples, the transistors 411, 421, 432, 434 and 441 may be p-type (p-channel) transistors and the transistors 412, 422, 431, 433 and 442 may be n-type (n-channel) transistors.

A respective resistive element 470-1, . . . , 470-6 of a predetermined first resistance RO is coupled between each of:

1) the drain terminal of the transistor 411 and the voltage supply input node 450;

2) the drain terminal of the transistor 412 and the reference supply input node 460;
3) the drain terminal of the transistor 421 and the voltage supply input node 450;
4) the drain terminal of the transistor 422 and the reference supply input node 460;
5) the drain terminal of the transistor 441 and the voltage supply input node 450; and
6) the drain terminal of the transistor 442 and the reference supply input node 460.

Further, a resistive element 480-1 of a predetermined second resistance Rs is coupled between the voltage supply input node 450 and the source terminals of the transistor 431 and the transistor 433. Similarly, the resistive element 480-2 of the second resistance Rs is coupled between the reference supply input node 460 and the source terminals of the transistor 432 and the transistor 434.

Each of the resistive elements 470-1, . . . , 470-6 as well as the resistive elements 480-1 and 480-2 may be a single resistor or comprise a plurality of coupled resistors.

The common gate stages (i.e. the paths 410 and 420) offer a first amplification of the differential input signal pair received at the input nodes 111 and 112 of the CDTA 400. The common gate stages are followed by two differential pairs (transistors 431 and 433 as well as transistors 432 and 434) with resistive degenerated source terminals. The proposed topology may allow to increase the overall open-loop gain of the CDTA 400 and make the circuitry fully differential.

The CDTA 400 may allow to define the open-loop input impedance $Z_{in}(f)$ by the equivalent common-gate stage. Further, the CDTA 400 may allow better control of the output common-mode voltage. The symmetry of the current differentiator unit (common-gate stages, i.e. the paths 410 and 420) and the transconductance amplifier (common source stage, i.e. the path 430) may enable an improved linearity and low distortion. Further, the CDTA 400 may provide a high bandwidth, (e.g. up to several GHz). In addition, the CDTA 400 may provide high precision having an open-loop gain ≥20 dB for up to several GHz.

Figure 5:
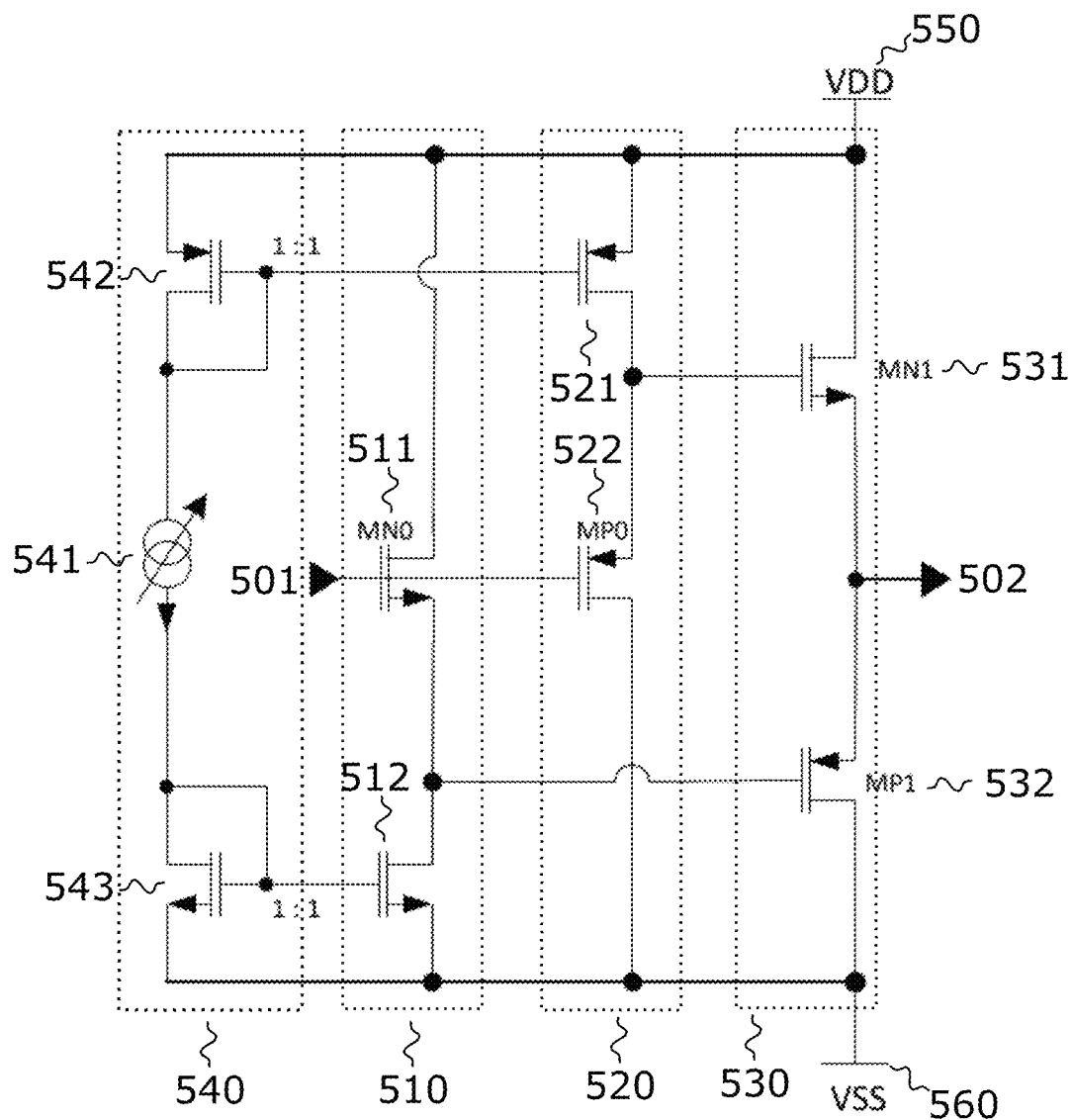
FIG. 5 illustrates an example of a source follower circuit.

An example of a source follower circuit 500 that may be used in a buffer circuit according to the proposed technology is illustrated in FIG. 5. The source follower circuit 500 may be used for at least one of the first follower circuit and the second follower circuit of the buffer circuit.

The source follower circuit 500 comprises a voltage supply input node 550 configured to receive a voltage supply signal (e.g. a positive supply voltage $V_{DD}$). Further, the source follower circuit 500 comprises a reference supply input node 560 configured to receive a reference supply signal (e.g. a negative supply voltage $V_{SS}$ or ground).

A first path 510, a second path 520, a third path 530 and biasing circuitry 540 are coupled in parallel between the voltage supply input node 550 and the reference supply input node 560. The first path 510 and the second path 520 are two common drain stages.

The first path 510 comprises a transistor 511 and a transistor 512 coupled in series. In particular, the drain terminal of the transistor 512 is coupled in series with the source terminal of the transistor 511. The drain terminal of the transistor 511 is coupled to the voltage supply input node 550. The source terminal of the transistor 512 is coupled to the reference supply input node 560.

The second path 520 comprises a transistor 521 and a transistor 522 coupled in series. In particular, the drain terminal of the transistor 521 is coupled in series with the source terminal of the transistor 522. The source terminal of the transistor 521 is coupled to the voltage supply input node 550. The drain terminal of the transistor 522 is coupled to the reference supply input node 560.

The gate terminals of the transistor 511 and the transistor 522 are coupled to an input node 501 of the source follower circuit 500 for receiving the respective output signal of the CDTA. For example, if the source follower circuit 500 is used as the first source follower circuit in the buffer circuit 100, the input node 501 receives the first output signal 103 of the CDTA 110. Analogously, if the source follower circuit 500 is used as the second source follower circuit in the buffer circuit 100, the input node 501 receives the second output signal 104 of the CDTA 110.

The third path 530 comprises a transistor 531 and a transistor 532 coupled in series. In particular, the source terminals of the transistors 531 and 532 are coupled in series. The drain terminal of the transistor 531 is coupled to the voltage supply input node 550. The drain terminal of the transistor 532 is coupled to the reference supply input node 560. The gate terminal of the transistor 531 is coupled to the source terminal of the transistor 522. The gate terminal of the transistor 532 is coupled to the source terminal of the transistor 511.

The biasing circuitry 540 is configured to supply a first bias signal to the gate terminal of the transistor 521. Further, the biasing circuitry 540 is configured to supply a second bias signal to the gate terminal of the transistor 512. Accordingly, the transistors 512 and 521 may be kept in a conductive state.

The biasing circuitry 540 of the source follower circuit 500 comprises a current source 541. The current source 541 is configured to output an adjustable bias current based on a control signal. The current source 541 may be understood as a programmable current source. For example, the control signal may be a digital control signal such that the current source 541 may be digitally controlled (i.e. based on digital data).

The biasing circuitry 540 further comprises a transistor 542 and a transistor 543. The drain terminals of the transistor 542 and the transistor 543 are coupled to the current source 541. The source terminal of the transistor 542 is coupled to the voltage supply input node 550. The source terminal of the transistor 543 is coupled to the reference supply input node 560.

The gate terminal of the transistor 542 is coupled to the current source 541 and the gate terminal of the transistor 521. Analogously, the gate terminal of the transistor 543 is coupled to the current source 541 and the gate terminal of the transistor 512.

The transistors 511, 512 and 531 are of a first conductivity type and the transistors 521, 522 and 532 are of a different second conductivity type. In the example of FIG. 5, the transistors 511, 512 and 531 are n-type (n-channel) transistors and the transistors 521, 522 and 532 are p-type (p-channel) transistors. However, the present disclosure is not limited thereto. In other examples, the transistors 511, 512 and 531 may be p-type (p-channel) transistors and the transistors 521, 522 and 532 may be n-type (n-channel) transistors.

The source follower circuit 500 may be used as voltage-follower output stage in a buffer circuit according to the proposed technology. The source follower circuit 500 may provide a low output impedance (also in open loop) and, hence, be suitable for driving high-speed sampling ADCs (e.g. sub-ADCs in a time-interleaved ADC). The symmetry of the source follower circuit 500's output impedance may enable a push/pull strength equalization. Further, a sinking and sourcing current may be limited by the supply capability. The modularity of the source follower circuit 500 may allow to provide multiple open-loop outputs which may be used for other purposes (e.g. power meter, RF envelop detector, etc.) without interfering with the main output path. In addition, the source follower circuit 500 may allow to digitally change the biasing current and, hence, provide a programmable driving strength. The source follower circuit 500 may further allow an independent control of the common-mode output voltage.

Figure 6:
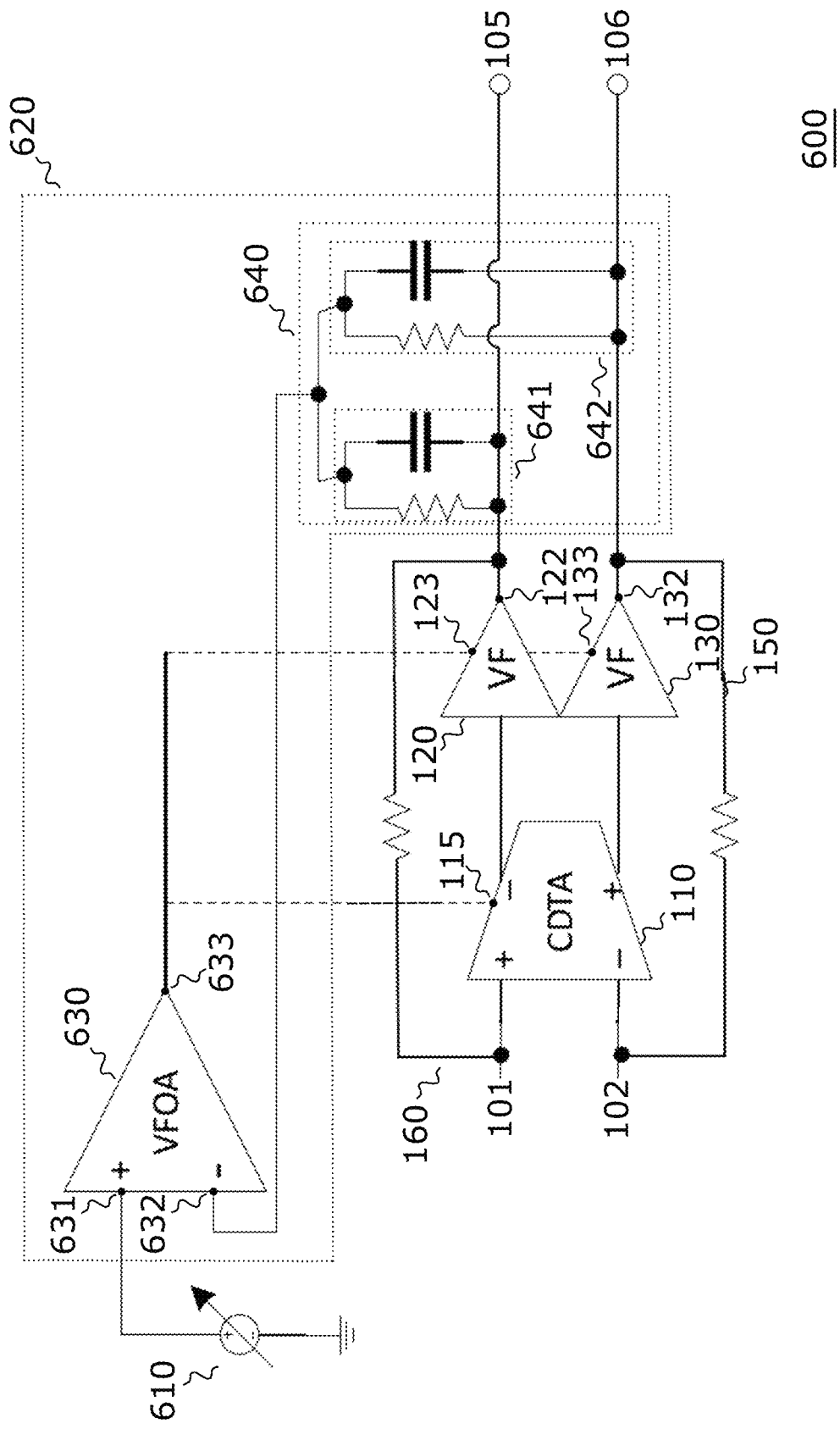
FIG. 6 illustrates a second example of a buffer circuit.

FIG. 6 illustrates another example of a buffer circuit 600. The buffer circuit 600 is based on the above described buffer circuit 100 and comprises further circuitry for adjusting the voltage supply signal for the CDTA 110 and the source follower circuits 120 and 130. Accordingly, the common-mode output voltage of the source follower circuits 120 and 130 may be adjusted. In particular, the voltage levels of the buffer output signals 105 and 106 may be adjusted by adjusting the voltage supply signal for the CDTA 110 and the source follower circuits 120 and 130. Other than that, the buffer circuit 600 is identical to the buffer circuit 100.

In comparison to the above described buffer circuit 100, the buffer circuit 600 additionally comprises a voltage source 610 and voltage supply generation circuitry 620. The voltage source 610 is configured to output an adjustable reference voltage based on a dedicated control signal. The voltage source 610 may be understood as a programmable voltage source. For example, the control signal may be a digital control signal such that the voltage source 610 may be digitally controlled (i.e. based on digital data). The voltage supply generation circuitry 620 is configured to generate, based on the reference voltage, the first buffer output signal 105 and the second buffer output signal 106, the voltage supply signal for the CDTA 110 and the source follower circuits 120 and 130.

The voltage supply generation circuitry 620 comprises averaging circuitry 640 configured to generate an averaged signal by averaging the first buffer output signal 105 and the second buffer output signal 106. The averaged signal may be the average of the first buffer output signal 105 and the second buffer output signal 106. In some example, the averaged signal may be the scaled average of the first buffer output signal 105 and the second buffer output signal 106. In terms of a mathematical expression, this may be expressed as follows:

$$V_{av} = K \cdot \left[\frac{V_{o1} + V_{o2}}{2}\right] \quad (2)$$

with $V_{av}$ denoting the averaged signal, $V_{o1}$ denoting the first buffer output signal 105, $V_{o2}$ denoting the second buffer output signal 106 and K denoting a scaling factor (K may be equal to one or be different from one). In case K<1, the averaged signal may be compared with a reference voltage (referred to the same reference potential) smaller than $(V_{o1}+V_{o2})/2$.

In the example of FIG. 6, the averaging circuitry 640 comprises a first low-pass filter 641 coupled to the output node 122 of the first source follower circuit 120 and a second low-pass filter 642 coupled to the output node 132 of the second source follower circuit 130. The first low-pass filter 641 allows generate a first signal indicative of the common-mode voltage of the first buffer output signal 105 by low-pass filtering the first buffer output signal 105. Similarly, the second low-pass filter 642 allows generate a second signal indicative of the common-mode voltage of the second buffer output signal 106 by low-pass filtering the second buffer output signal 106. The first and second signals of the low-pass filters 641 and 642 are combined to the averaged signal. The low-pass filters 641 and 642 may, e.g., be implemented respectively with a resistive element (e.g. a single resistor or a plurality of coupled resistors) with resistance $R_{CM}$ and a capacitive element (e.g. a single capacitor or a plurality of coupled capacitors) with capacitance $C_{CM}$ connected to the output node of the respective source follower circuit. The cut-off frequency of the low-pass filters 641 and 642 may, e.g., be selected (designed) in accordance with and (e.g. RF) input signal constraint in order to extract the common-mode output voltage.

However, it is to be noted that the present disclosure is not limited to using low-pass filters for the averaging circuitry 640. In other examples, a resistive network with a capacitive feed-forward network (compensated resistive divider) may be used instead. For realizing a scaling factor K<1, an additional resistive division (via a corresponding resistive element) after the summing point of that network may be provided.

The voltage supply generation circuitry 620 further comprises an operational amplifier 630. The operational amplifier 630 comprises a first input node 631 coupled to the voltage source 610 such that the operational amplifier 630 is configured to receive the reference voltage at the first input node 631 of the operational amplifier 630. The operational amplifier 630 further comprises a second input node 632 coupled to the averaging circuitry 640 such that the operational amplifier 630 is configured to receive the averaged signal at the second input node 632 of the operational amplifier 630.

The operational amplifier 630 is configured to generate the voltage supply signal based on the reference voltage and the averaged signal. In particular, the operational amplifier 630 may be configured to generate the voltage supply signal to correspond to the voltage difference between the reference voltage and the averaged signal. As the reference voltage is adjustable, the voltage level of the voltage supply signal for the CDTA 110 and the source follower circuits 120 and 130 is adjustable. By adjusting the voltage level of the voltage supply signal for the CDTA 110 and the source follower circuits 120 and 130, the common-mode voltage of the buffer output signals 105 and 106 may be adjusted.

For example, the output common-mode voltage of the RF buffer 600 may be changed digitally by digitally changing the reference voltage input to the operational amplifier 630. Accordingly, the output common-mode voltage of the RF buffer 600 may be independent and programmable (e.g. independent from a biasing current of the source follower circuits 120 and 130).

For example, the voltage supply signal may be controlled to be $2 \times V_{CMO}$, wherein $V_{CMO}$ denotes the common-mode voltage output by the RF buffer 600 (i.e. the common-mode voltage of the buffer output signals 105 and 106). This may allow to maintain equal voltage headroom between both paths of the RF buffer 600.

In the example of FIG. 6, a respective voltage supply input node 115, 123, 133 of the CDTA 110, the first source follower circuit 120 and the second source follower circuit 130 is coupled to the output node 633 of the operational amplifier 630 such that voltage supply generation circuitry 620 supplies the voltage supply signal to the CDTA 110, the first source follower circuit 120 and the second source follower circuit 130. However, it is to be noted that in other examples not all of the CDTA 110, the first source follower circuit 120 and the second source follower circuit 130 may receive the voltage supply signal from the voltage supply generation circuitry 620. In other examples, the voltage supply generation circuitry 620 may supply the voltage supply signal only to part of the CDTA 110, the first source follower circuit 120 and the second source follower circuit 130. For example, the voltage supply generation circuitry 620 may supply the voltage supply signal only to the CDTA 110. Also when supplying the voltage supply signal only to part of the CDTA 110, the first source follower circuit 120 and the second source follower circuit 130, the common-mode voltage of the buffer output signals 105 and 106 may be adjusted.

The voltage source 610 and the voltage supply generation circuitry 620 may be understood as an exemplary implementation of a Low-DropOut (LDO) voltage regulator that is configured to generate and supply, based on a control signal (e.g. a digital control signal encoded with digital data), the voltage supply signal for at least one of the CDTA 110, the first source follower circuit 120 and the second source follower circuit 130.

Figure 7:
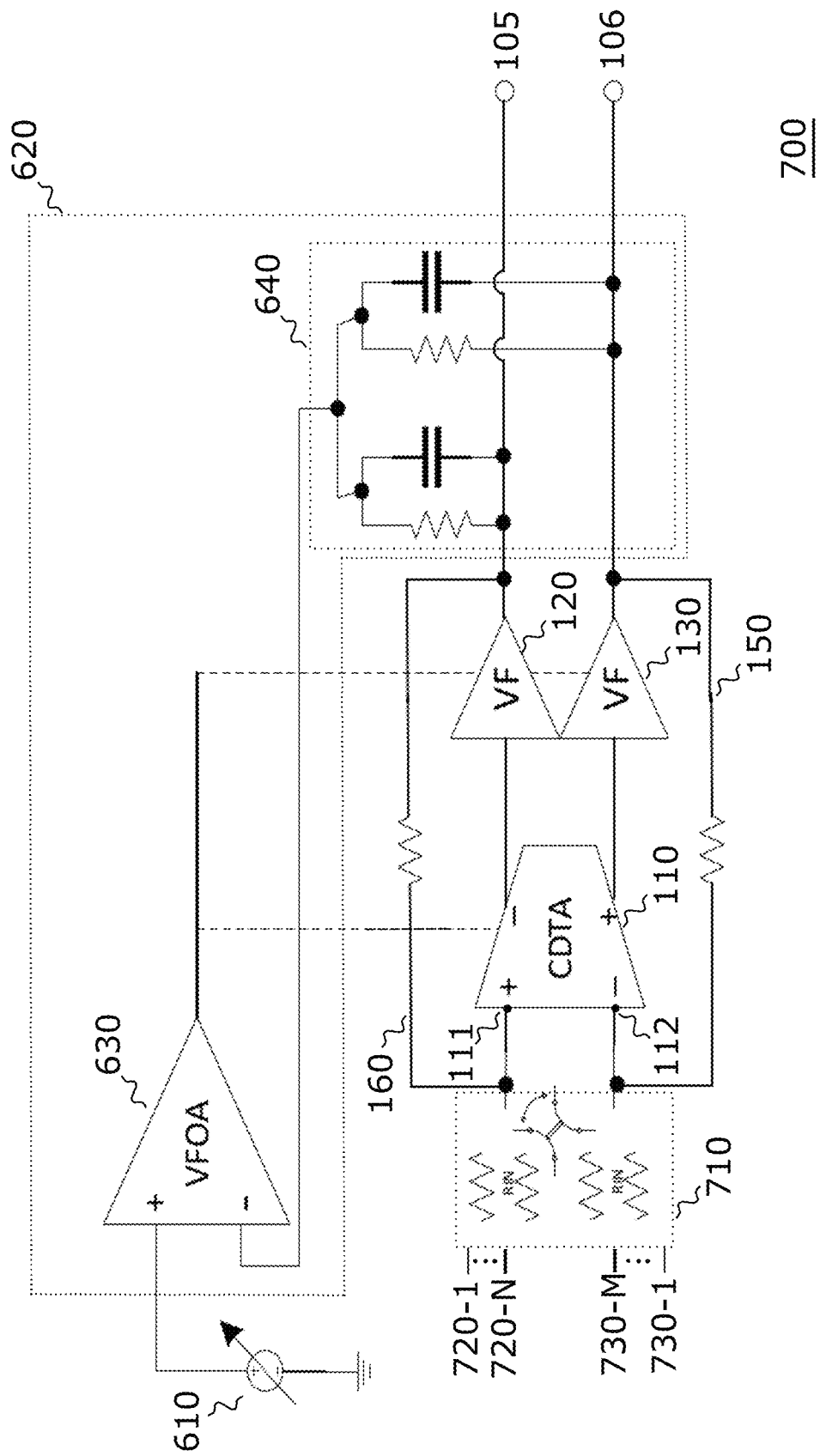
FIG. 7 illustrates a third example of a buffer circuit.

FIG. 7 illustrates another example of a buffer circuit 700. The buffer circuit 700 is based on the above described buffer circuit 600 and comprises further circuitry for selectively controlling the signals input to the input nodes 111 and 112 of the CDTA 110. Other than that, the buffer circuit 700 is identical to the buffer circuit 600.

In comparison to the above described buffer circuit 600, the buffer circuit 700 additionally comprises a multiplexer circuit 710. The multiplexer circuit 710 is configured to selectively couple one or more of a plurality of first input nodes 720-1, ..., 720-N of the buffer circuit 700 to the first input node 111 of the CDTA 110. Analogously, the multiplexer circuit 710 is configured to selectively couple one or more of a plurality of second input nodes 730-1, ..., 730-M of the buffer circuit 700 to the second input node 112 of the CDTA 110. The plurality of first input nodes 720-1, ..., 720-N may comprise any number N≥2 input nodes. Similarly, the plurality of second input nodes 730-1, ..., 730-M may comprise any number M≥2 input nodes. N and M are integers, which may be identical to or be different from each other.

By selectively coupling one or more of the plurality of first input nodes 720-1, ..., 720-N to the first input node 111 of the CDTA 110, the first signal input to the first input node 111 of the CDTA 110 may be selected/generated among/based on the signals received at the plurality of first input nodes 720-1, ..., 720-N. Analogously, by selectively coupling one or more of the plurality of second input nodes 730-1, ..., 730-M to the second input node 112 of the CDTA 110, the second signal input to the second input node 112 of the CDTA 110 may be selected/generated among/based on the signals received at the plurality of second input nodes 730-1, ..., 730-M.

For example, the multiplexer circuit 710 may receive one or more control signals (e.g. from circuitry external to the buffer circuit 700) and selectively couple the one or more of the plurality of first input nodes 720-1, ..., 720-N of the buffer circuit 700 to the first input node 111 of the CDTA 110 based on the one or more control signals. Similarly, the multiplexer circuit 710 may selectively couple the one or more of the plurality of second input nodes 730-1, ..., 730-M of the buffer circuit 700 to the second input node 112 of the CDTA 110 based on the one or more control signals.

In the following, some examples for signals that may be selectively supplied to the input node 111 and 112 of the CDTA 110 by the multiplexer circuit 710 will be described with reference to FIGS. 8 to 10. However, it is to be noted that the present disclosure is not limited thereto and that also other signals that may be selectively supplied to the input node 111 and 112 of the CDTA 110 by the multiplexer circuit 710.

Figure 8:
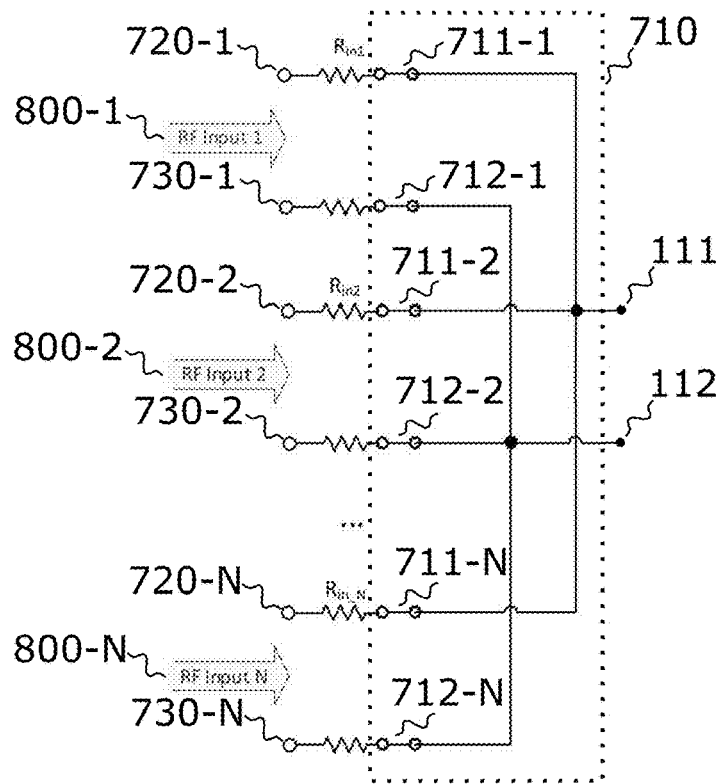
FIG. 8 illustrates a first example of a multiplexer circuit.

In the example of FIG. 8, the buffer circuit 700 comprises N first input nodes 720-1, ..., 720-N and N second input nodes 730-1, ..., 730-N. The first input node 720-1 receives a first RF signal and the second input node 730-1 receives a second RF signal, the first and the second RF signal forming a first differential RF signal pair 800-1 (e.g. a differential RF receive signal pair). Similarly, the first input node 720-2 receives a third RF signal and the second input node 730-2 receives a fourth RF signal, the third and the fourth RF signal forming a second differential RF signal pair 800-2. The first input node 720-N receives a (2N−1)-th RF signal and the second input node 730-N receives a 2N-th RF signal, the (2N−1)-th and the 2N-th RF signal forming an N-th differential RF signal pair 800-N. Similarly all other first and second input nodes receive a respective RF signal such that each pair of first and second input nodes receives a respective differential RF signal pair.

The multiplexer circuit 710 comprises a plurality of first switches 711-1, ..., 711-N each coupled in series with a respective one of the first input nodes 720-1, ..., 720-N for selectively coupling one or more of the first input nodes 720-1, ..., 720-N to the first input node 111 of the CDTA 110. Analogously, the multiplexer circuit 710 comprises a plurality of second switches 712-1, ..., 712-N each coupled in series with a respective one of the second input nodes 730-1, ..., 730-N for selectively coupling one or more of the second input nodes 730-1, ..., 730-N to the second input node 112 of the CDTA 110. Accordingly, the multiplexer circuit 710 may allow to supply one or more of the differential RF signal pairs 800-1, ..., 800-N to the input nodes 111 and 112 of the CDTA 110.

Figure 9:
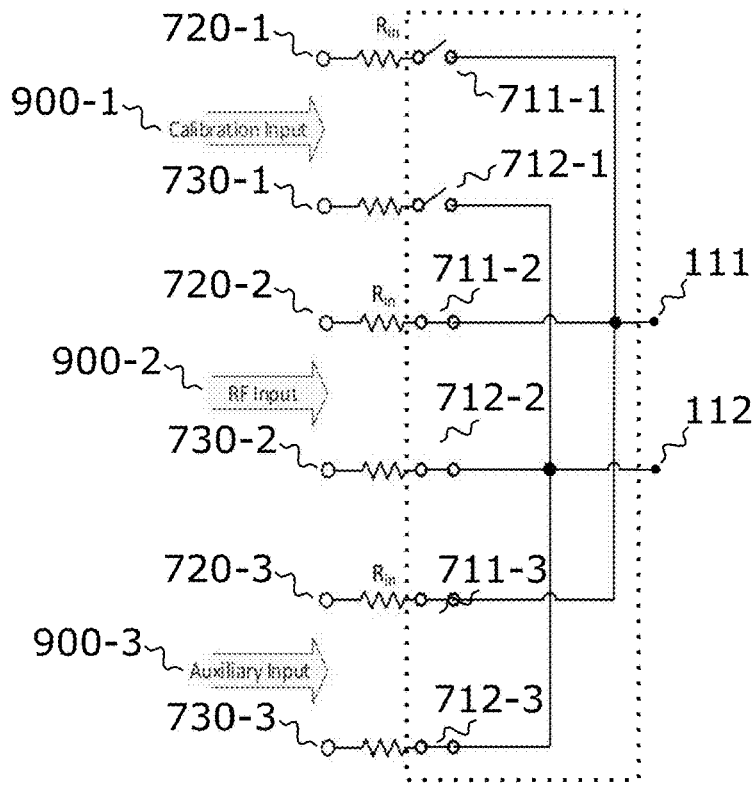
FIG. 9 illustrates a second example of a multiplexer circuit.

In the example of FIG. 9, the buffer circuit 700 comprises three first input nodes 720-1, ..., 720-3 and three second input nodes 730-1, ..., 730-3. The first input node 720-1 receives a first calibration signal and the second input node 730-1 receives a second calibration signal, the first and the second calibration signal forming a differential calibration signal pair 900-1 for circuitry coupled to (the output nodes 122 and 132 of) the first and the second source follower circuits 120 and 130. For example, the circuitry coupled to the first and the second source follower circuits 120 and 130 may be an ADC. The first input node 720-2 receives a first RF signal and the second input node 730-2 receives a second RF signal, the first and the second RF signal forming a differential RF signal pair 900-2 (e.g. a differential RF receive signal pair). The first input node 720-3 receives a first auxiliary input signal and the second input node 730-3 receives a second auxiliary input signal, the first and the second auxiliary input signal forming a differential auxiliary input signal pair 900-3.

The multiplexer circuit 710 comprises three first switches 711-1, ..., 711-3 each coupled in series with a respective one of the first input nodes 720-1, ..., 720-3 for selectively coupling one or more of the first input nodes 720-1, ..., 720-3 to the first input node 111 of the CDTA 110. Analogously, the multiplexer circuit 710 comprises three second switches 712-1, ..., 712-3 each coupled in series with a respective one of the second input nodes 730-1, ..., 730-3 for selectively coupling one or more of the second input nodes 730-1, ..., 730-3 to the second input node 112 of the CDTA 110. Accordingly, the multiplexer circuit 710 may allow to supply one or more of the differential calibration signal pair 900-1, the differential RF signal pair 900-2 and the differential auxiliary input signal pair 900-3 to the input nodes 111 and 112 of the CDTA 110. For example, the multiplexer circuit 710 may be controlled to selectively supply the differential calibration signal pair 900-1 to the input nodes 111 and 112 of the CDTA 110 during a calibration phase of an ADC coupled to the first and the second source follower circuits 120 and 130 of the buffer circuit 700 and to selectively supply the differential RF signal pair 900-2 to the input nodes 111 and 112 of the CDTA 110 during a regular (normal) operation phase of the ADC.

Figure 10:
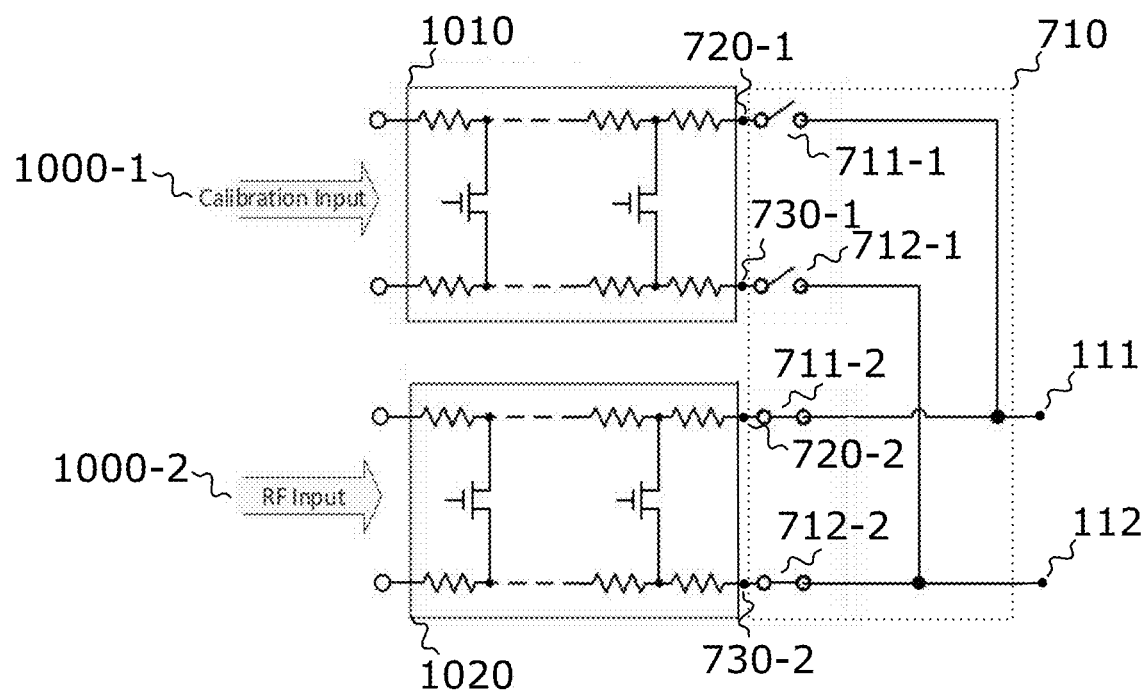
FIG. 10 illustrates a third example of a multiplexer circuit.

In the example of FIG. 10, the buffer circuit 700 comprises two first input nodes 720-1 and 720-2 as well as two second input nodes 730-1 and 730-2. The first input node 720-1 and the second input node 730-1 are coupled to a first attenuator 1010 (e.g. a digital step attenuator). The first attenuator 1010 receives a differential calibration signal pair 1000-1 and is configured to selectively attenuate the differential calibration signal pair 1000-1. The differential calibration signal pair 1000-1 is for circuitry such as an ADC coupled to (the output nodes 122 and 132 of) the first and the second source follower circuits 120 and 130. The first input node 720-2 and the second input node 730-2 are coupled to a second attenuator 1020 (e.g. a digital step attenuator). The second attenuator 1020 receives a differential RF signal pair 1000-2 and is configured to selectively attenuate the differential RF signal pair 1000-2.

The multiplexer circuit 710 comprises two first switches 711-1 and 711-2 each coupled in series with a respective one of the first input nodes 720-1 and 720-2 for selectively coupling one or more of the first input nodes 720-1 and 720-2 to the first input node 111 of the CDTA 110. Analogously, the multiplexer circuit 710 comprises two second switches 712-1 and 712-2 each coupled in series with a respective one of the second input nodes 730-1 and 730-2 for selectively coupling one or more of the second input nodes 730-1 and 730-2 to the second input node 112 of the CDTA 110. Accordingly, the multiplexer circuit 710 may allow to supply one or more of the selectively attenuated differential calibration signal pair 1000-1 and the selectively attenuated differential RF signal pair 1000-2 to the input nodes 111 and 112 of the CDTA 110. For example, the multiplexer circuit 710 may be controlled to selectively supply the selectively attenuated differential calibration signal pair 1000-1 to the input nodes 111 and 112 of the CDTA 110 during a calibration phase of an ADC coupled to the first and the second source follower circuits 120 and 130 of the buffer circuit 700 and to selectively supply the selectively attenuated differential RF signal pair 1000-2 to the input nodes 111 and 112 of the CDTA 110 during a regular (normal) operation phase of the ADC.

In the examples of FIGS. 8 to 10, each of the first switches and the second switches may be controlled based on one or more of the one or more control signals for the multiplexer circuit 710. The first switches and the second switches may, e.g., be implemented as semiconductor switches.

Figure 11:
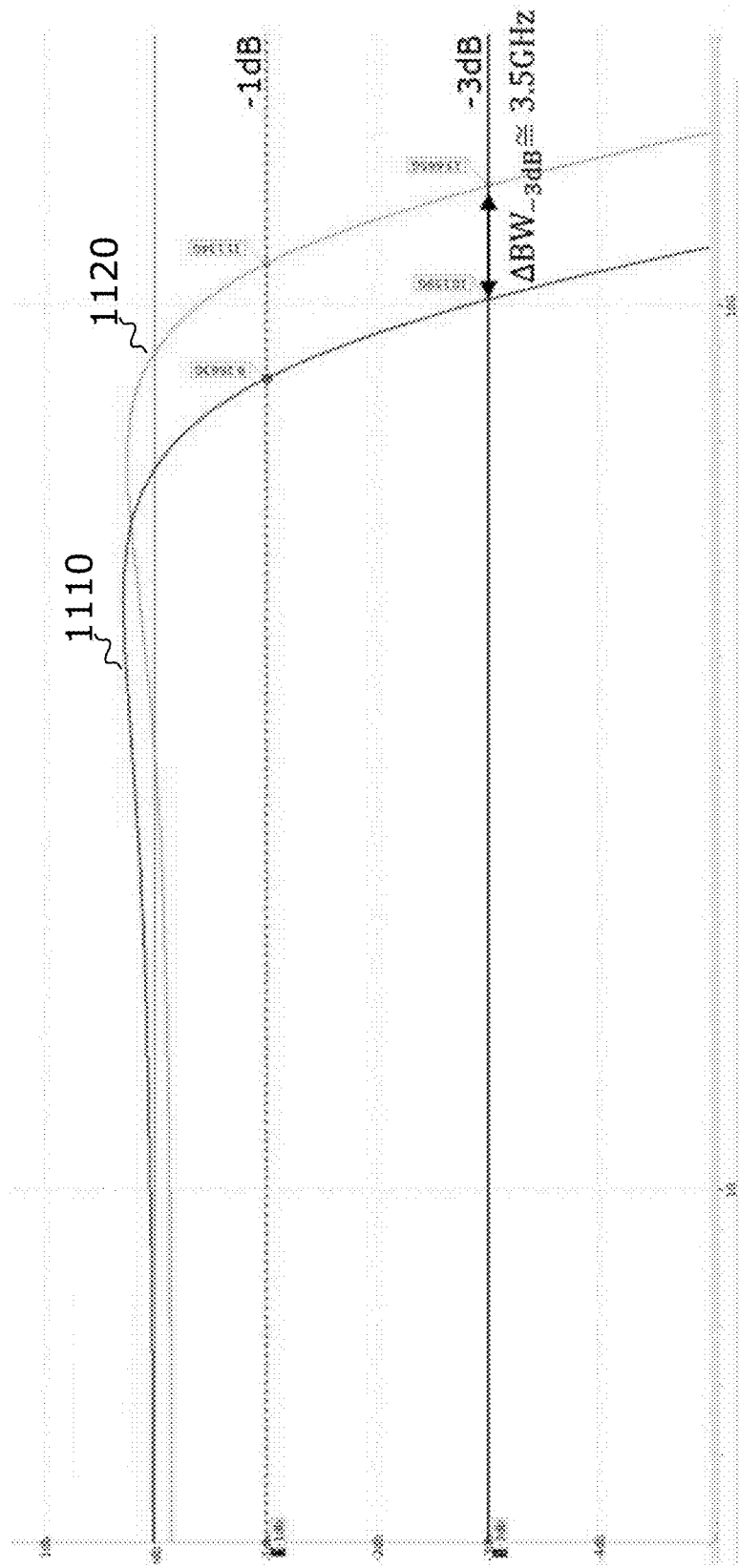
FIG. 11 illustrates exemplary transfer functions of buffer circuits.

FIG. 11 further illustrates two exemplary transfer functions 1110 and 1120 of buffer circuits according to the present disclosure. As can be seen from FIG. 11, both transfer functions 1110 and 1120 show a cut-off frequency at −3 dB of 10 GHz or more. This makes the buffer circuits according to the present disclosure particularly suitable for $5^{th}$ Generation New Radio (5G NR) devices such as base stations or mobile devices.

Figure 12:
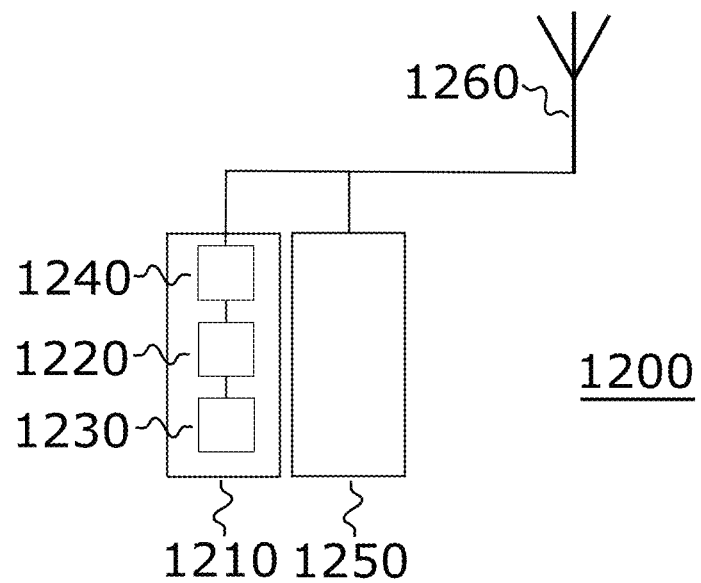
FIG. 12 illustrates an example of a base station.

An example of an implementation using buffering according to one or more aspects of the architecture described above in connection with FIGS. 1 to 10 or one or more examples described above in connection with FIGS. 1 to 10 is illustrated in FIG. 12. FIG. 12 schematically illustrates an example of a radio base station 1200 (e.g. for a femtocell, a picocell, a microcell or a macrocell) comprising a buffer circuit 1220 as proposed.

A receiver 1210 of the base station 1200 comprises the buffer circuit 1220. The receiver 1210 additionally comprises analog circuitry 1240 configured to receive an RF receive signal from at least one antenna element 1260 of the base station 1200. The first input node and the second input node of the buffer circuit 1220's CDTA are coupled to the analog circuitry 1240 such that the analog circuitry 1240 is configured to supply a first signal and a second signal (e.g. forming a differential signal pair) to the buffer circuit 1220 based on the RF receive signal. For example, the analog circuitry 1240 may be an analog RF front-end and comprising one or more of a Low-Noise Amplifier (LNA), filter, a down-conversion mixer, ElectroStatic Discharge (ESD) protection circuitry, at least one attenuator configured to selectively attenuate the RF receive signal, etc.

An ADC 1230 is coupled to the buffer circuit 1220. The buffer circuit 1220 buffers the first signal and the second signal for the ADC 1230 and supplies the first and the second buffer output signal to the ADC 1230. The ADC 1230 is configured to generate digital output data based on the first and the second buffer output signal.

Further, the base station 1200 comprises a transmitter 1250 configured to generate an RF transmit signal. The transmitter 1250 may use the antenna element 1260 or another antenna element (not illustrated) of the base station 1200 for radiating the RF transmit signal to the environment.

To this end, a base station with improved analog-to-digital conversion capabilities may be provided.

The base station 1200 may comprise further elements such as, e.g., an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a LDO voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 13:
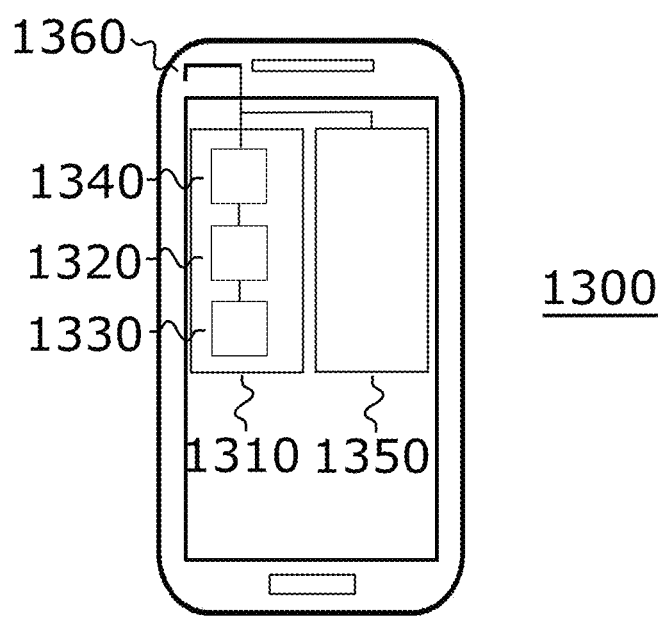
FIG. 13 illustrates an example of a mobile device.

Another example of an implementation using buffering according to one or more aspects of the architecture described above in connection with FIGS. 1 to 10 or one or more examples described above in connection with FIGS. 1 to 10 is illustrated in FIG. 13. FIG. 13 schematically illustrates an example of a mobile device 1300 (e.g. mobile phone, smartphone, tablet-computer, or laptop) comprising buffer circuit 1320 as proposed.

A receiver 1310 of the mobile device 1300 comprises the buffer circuit 1320. The receiver 1310 additionally comprises analog circuitry 1340 configured to receive an RF receive signal from at least one antenna element 1360 of the mobile device 1300. The first input node and the second input node of the buffer circuit 1320's CDTA are coupled to the analog circuitry 1340 such that the analog circuitry 1340 is configured to supply a first signal and a second signal (e.g. forming a differential signal pair) to the buffer circuit 1320 based on the RF receive signal. For example, the analog circuitry 1340 may be an analog RF front-end and comprising one or more of a LNA, filter, a down-conversion mixer, ESD protection circuitry, at least one attenuator configured to selectively attenuate the RF receive signal, etc.

An ADC 1330 is coupled to the buffer circuit 1320. The buffer circuit 1320 buffers the first signal and the second signal for the ADC 1330 and supplies the first and the second buffer output signal to the ADC 1330. The ADC 1330 is configured to generate digital output data based on the first and the second buffer output signal.

To this end, a mobile device with improved analog-to-digital conversion capabilities may be provided.

The mobile device 1300 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I²C or universal programmable serial interface module, RTC, timer-counters including interval and watchdog timers, general purpose input-output (IO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using buffering according to the proposed architecture or one or more of the examples described above may be configured to operate according to one of the 3rd Generation Partnership Project (3GPP)-standardized mobile communication networks or systems. The mobile or wireless communication system may correspond to, for example, a 5G NR, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Interoperability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples described herein may be summarized as follows:

Example 1 is a buffer circuit, comprising: a current differencing transconductance amplifier, CDTA, comprising a first input node and a second input node each configured to receive a respective one of a first signal and a second signal; a first source follower circuit coupled to a first output node of the CDTA and configured to generate a first buffer output signal based on a first output signal of the CDTA; a second source follower circuit coupled to a second output node of the CDTA and configured to generate a second buffer output signal based on a second output signal of the CDTA; a first feedback path comprising at least one of a first resistive element and a first capacitive element, wherein the first feedback path couples an output node of the first source follower circuit to the first input node of the CDTA; and a second feedback path comprising at least one of a second resistive element and a second capacitive element, wherein the second feedback path couples an output node of the second source follower circuit to the second input node of the CDTA.

Example 2 is the buffer circuit of example 1, wherein the first feedback path is configured to supply a first feedback current to the first input node of the CDTA based on the first buffer output signal.

Example 3 is the buffer circuit of example 1 or example 2, wherein the second feedback path is configured to supply a second feedback current to the second input node of the CDTA based on the second buffer output signal.

Example 4 is the buffer circuit of any of examples 1 to 3, further comprising: a voltage source configured to output an adjustable reference voltage based on a control signal; and voltage supply generation circuitry configured to generate, based on the reference voltage and at least one of the first buffer output signal and the second buffer output signal, a voltage supply signal for at least one of the CDTA, the first source follower circuit and the second source follower circuit.

Example 5 is the buffer circuit of example 4, wherein the voltage supply generation circuitry is configured to supply the voltage supply signal to the CDTA, the first source follower circuit and the second source follower circuit.

Example 6 is the buffer circuit of example 4 or example 5, wherein the voltage supply generation circuitry comprises: averaging circuitry configured to generate an averaged signal by averaging the first buffer output signal and the second buffer output signal; and an operational amplifier configured to: receive the reference voltage at a first input node of the operational amplifier; receive the averaged signal at a second input node of the operational amplifier; and generate the voltage supply signal based on the reference voltage and the averaged signal.

Example 7 is the buffer circuit of example 6, wherein a respective voltage supply input node of the CDTA, the first source follower circuit and the second source follower circuit is coupled to an output node of the operational amplifier.

Example 8 is the buffer circuit of any of examples 1 to 7, wherein the CDTA further comprises: a voltage supply input node configured to receive a voltage supply signal; a reference supply input node configured to receive a reference supply signal; a first path comprising a first transistor and a second transistor, wherein source terminals of the first transistor and the second transistor are coupled to the first input node of the CDTA, wherein a drain terminal of the first transistor is coupled to the voltage supply input node, and wherein a drain terminal of the second transistor is coupled to the reference supply input node; a second path comprising a third transistor and a fourth transistor, wherein source terminals of the third transistor and the fourth transistor are coupled to the second input node of the CDTA, wherein a drain terminal of the third transistor is coupled to the voltage supply input node, and wherein a drain terminal of the fourth transistor is coupled to the reference supply input node; and biasing circuitry configured to supply a first bias signal to gate terminals of the first transistor and the third transistor and to supply a second bias signal to gate terminals of the second transistor and the fourth transistor, wherein the first transistor and the third transistor are of a first conductivity type, and wherein the second transistor and the fourth transistor are of a second conductivity type, the second conductivity type being different from the first conductivity type.

Example 9 is the buffer circuit of example 8, wherein a respective resistive element of a predetermined first resistance is coupled between each of: the drain terminal of the first transistor and the voltage supply input node; the drain terminal of the second transistor and the reference supply input node; the drain terminal of the third transistor and the voltage supply input node; and the drain terminal of the fourth transistor and the reference supply input node.

Example 10 is the buffer circuit of example 8 or example 9, wherein the CDTA further comprises: a third path comprising a fifth transistor, a sixth transistor, a seventh transistor and an eighth transistor, wherein a gate terminal of the fifth transistor is coupled to the drain terminal of the first transistor, wherein a gate terminal of the sixth transistor is coupled to the drain terminal of the second transistor, wherein drain terminals of the fifth transistor and sixth transistor are coupled to the first output node of the CDTA, wherein a source terminal of the fifth transistor is coupled to the voltage supply input node, wherein a source terminal of the sixth transistor is coupled to the reference supply input node, wherein a gate terminal of the seventh transistor is coupled to the drain terminal of the third transistor, wherein a gate terminal of the eighth transistor is coupled to the drain terminal of the fourth transistor, wherein drain terminals of the seventh transistor and eighth transistor are coupled to the second output node of the CDTA, wherein a source terminal of the seventh transistor is coupled to the voltage supply input node, wherein a source terminal of the eighth transistor is coupled to the reference supply input node, wherein the sixth transistor and the eighth transistor are of the first conductivity type, and wherein the fifth transistor and the seventh transistor are of the second conductivity type.

Example 11 is the buffer circuit of example 10, wherein a respective resistive element of a predetermined second resistance is coupled between each of: the voltage supply input node and the source terminals of the fifth transistor and the seventh transistor; and the reference supply input node and the source terminals of the sixth transistor and the eighth transistor.

Example 12 is the buffer circuit of example 10 or example 11, wherein the fifth transistor and the sixth transistor are coupled in parallel to the seventh transistor and the eighth transistor.

Example 13 is the buffer circuit of any of examples 8 to 12, wherein the biasing circuitry of the CDTA comprises: a nineth transistor of the first conductivity type; and a tenth transistor of the second conductivity type, wherein a gate terminal of the nineth transistor is coupled to the gate terminals of the first transistor and the third transistor, wherein a gate terminal of the tenth transistor is coupled to the gate terminals of the second transistor and the fourth transistor, wherein source terminals of the nineth transistor and the tenth transistor are coupled in series, wherein a drain terminal of the nineth transistor is coupled to the voltage supply input node and the gate terminal of the nineth transistor, and wherein a drain terminal of the tenth transistor is coupled to the reference supply input node and the gate terminal of the tenth transistor.

Example 14 is the buffer circuit of example 13, wherein a respective resistive element of a predetermined first resistance is coupled between each of: the drain terminal of the nineth transistor and the voltage supply input node; and the drain terminal of the tenth transistor and the reference supply input node.

Example 15 is the buffer circuit of example 13 or example 14, wherein bulk terminals of the first transistor, the third transistor and the nineth transistor are coupled with each other, and wherein the bulk terminals of the first transistor, the third transistor and the nineth transistor are coupled with the source terminal of the nineth transistor.

Example 16 is the buffer circuit of any of examples 13 to 15, wherein bulk terminals of the second transistor, the fourth transistor and the tenth transistor are coupled with each other, and wherein the bulk terminals of the second transistor, the fourth transistor and the tenth transistor are coupled with the source terminal of the tenth transistor.

Example 17 is the buffer circuit of any of examples 1 to 16, wherein the first source follower circuit comprises: a voltage supply input node configured to receive a voltage supply signal; a reference supply input node configured to receive a reference supply signal; a first path comprising a first transistor and a second transistor coupled in series, wherein a drain terminal of the first transistor is coupled to the voltage supply input node, and wherein a source terminal of the second transistor is coupled to the reference supply input node; a second path comprising a third transistor and a fourth transistor coupled in series, wherein a source terminal of the third transistor is coupled to the voltage supply input node, and wherein a drain terminal of the fourth transistor is coupled to the reference supply input node; a third path comprising a fifth transistor and a sixth transistor, wherein source terminals of the fifth transistor and the sixth transistor are coupled to the output node of the first source follower circuit, wherein a drain terminal of the fifth transistor is coupled to the voltage supply input node, wherein a drain terminal of the sixth transistor is coupled to the reference supply input node, wherein a gate terminal of the fifth transistor is coupled to the source terminal of the fourth transistor, wherein a gate terminal of the sixth transistor is coupled to the source terminal of the first transistor; and biasing circuitry configured to supply a first bias signal to a gate terminal of the third transistor and to supply a second bias signal to a gate terminal of the second transistor, wherein gate terminals of the first transistor and the fourth transistor are coupled to an input node of the first source follower circuit for receiving the first output signal of the CDTA.

Example 18 is the buffer circuit of example 17, wherein the first transistor, the second transistor and the fifth transistor of the first source follower circuit are of a first conductivity type, and wherein the third transistor, the fourth transistor and the sixth transistor of the first source follower circuit are of a second conductivity type, the second conductivity type being different from the first conductivity type.

Example 19 is the buffer circuit of example 17 or example 18, wherein the biasing circuitry of the first source follower circuit comprises: a current source configured to output an adjustable bias current based on a control signal; and a seventh transistor of the second conductivity type; and an eighth transistor of the first conductivity type, wherein drain terminals of the seventh transistor and the eighth transistor are coupled to the current source, wherein a source terminal of the seventh transistor is coupled to the voltage supply input node, wherein a source terminal of the eighth transistor is coupled to the reference supply input node, wherein a gate terminal of the seventh transistor is coupled to the current source and the gate terminal of the third transistor, and wherein a gate terminal of the eighth transistor is coupled to the current source and the gate terminal of the second transistor.

Example 20 is the buffer circuit of any of examples 1 to 19, further comprising a multiplexer circuit configured to: selectively couple one or more of a plurality of first input nodes of the buffer circuit to the first input node of the CDTA; and selectively couple one or more of a plurality of second input nodes of the buffer circuit to the second input node of the CDTA.

Example 21 is the buffer circuit of example 20, wherein at least one of the plurality of first input nodes of the buffer circuit is for receiving a first calibration signal, and wherein at least one of the plurality of second input nodes of the buffer circuit is for receiving a second calibration signal, the first and the second calibration signals forming a differential calibration signal pair for circuitry coupled to the first and the second source follower circuits.

Example 22 is the buffer circuit of example 20 or example 21, wherein at least one of the plurality of first input nodes of the buffer circuit is for receiving a first radio frequency signal, and wherein at least one of the plurality of second input nodes of the buffer circuit is for receiving a second radio frequency signal, the first and the second radio frequency receive signals forming a differential radio frequency signal pair.

Example 23 is a receiver, comprising: a buffer circuit according to any of examples 1 to 22; and an analog-to-digital converter coupled to the buffer circuit and configured to generate digital output data based on the first and the second buffer output signal.

Example 24 is the receiver of example 23, further comprising: analog circuitry configured to receive a radio frequency receive signal from an antenna element, wherein the first input node and the second input node of the CDTA are coupled to the analog circuitry.

Example 25 is the receiver of example 24, wherein the analog circuitry comprises at least one attenuator circuit configured to selectively attenuate the radio frequency receive signal.

Example 26 is a base station, comprising: a receiver according to any of examples 23 to 25; and a transmitter configured to generate a radio frequency transmit signal.

Example 27 is the base station of example 26, further comprising at least one antenna element coupled to at least one of the receiver and the transmitter.

Example 28 is a mobile device, comprising: a receiver according to any of examples 23 to 25; and a transmitter configured to generate a radio frequency transmit signal.

Example 29 is the mobile device of example 28, further comprising at least one antenna element coupled to at least one of the receiver and the transmitter.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A buffer circuit, comprising:
a current differencing transconductance amplifier, CDTA, configured to operate in a current mode, the CDTA comprising a first input node and a second input node each configured to receive a respective one of a first signal and a second signal;
a first source follower circuit coupled to a first output node of the CDTA and configured to generate a first buffer output signal based on a first output signal of the CDTA;
a second source follower circuit coupled to a second output node of the CDTA and configured to generate a second buffer output signal based on a second output signal of the CDTA;
a first feedback path comprising at least one of a first resistive element and a first capacitive element, wherein the first feedback path couples an output node of the first source follower circuit to the first input node of the CDTA; and
a second feedback path comprising at least one of a second resistive element and a second capacitive element, wherein the second feedback path couples an output node of the second source follower circuit to the second input node of the CDTA.

2. The buffer circuit of claim 1, wherein the first feedback path is configured to supply a first feedback current to the first input node of the CDTA based on the first buffer output signal.

3. The buffer circuit of claim 1, wherein the second feedback path is configured to supply a second feedback current to the second input node of the CDTA based on the second buffer output signal.

4. The buffer circuit of claim 1, further comprising:
a voltage source configured to output a reference voltage that is adjustable based on a control signal; and
voltage supply generation circuitry configured to generate, based on the reference voltage and at least one of the first buffer output signal and the second buffer output signal, a voltage supply signal for at least one of the CDTA, the first source follower circuit and the second source follower circuit.

5. The buffer circuit of claim 4, wherein the voltage supply generation circuitry is configured to supply the voltage supply signal to the CDTA, the first source follower circuit and the second source follower circuit.

6. The buffer circuit of claim 4, wherein the voltage supply generation circuitry comprises:
averaging circuitry configured to generate an averaged signal by averaging the first buffer output signal and the second buffer output signal; and
an operational amplifier configured to:
receive the reference voltage at a first input node of the operational amplifier;
receive the averaged signal at a second input node of the operational amplifier; and
generate the voltage supply signal based on the reference voltage and the averaged signal.

7. The buffer circuit of claim 6, wherein a respective voltage supply input node of the CDTA, the first source follower circuit and the second source follower circuit is coupled to an output node of the operational amplifier.

8. The buffer circuit of claim 1, wherein the CDTA further comprises:
a voltage supply input node configured to receive a voltage supply signal;
a reference supply input node configured to receive a reference supply signal;
a first path comprising a first transistor and a second transistor, wherein source terminals of the first transistor and the second transistor are coupled to the first input node of the CDTA, wherein a drain terminal of the first transistor is coupled to the voltage supply input node, and wherein a drain terminal of the second transistor is coupled to the reference supply input node;
a second path comprising a third transistor and a fourth transistor, wherein source terminals of the third transistor and the fourth transistor are coupled to the second input node of the CDTA, wherein a drain terminal of the third transistor is coupled to the voltage supply input node, and wherein a drain terminal of the fourth transistor is coupled to the reference supply input node; and
biasing circuitry configured to supply a first bias signal to gate terminals of the first transistor and the third transistor and to supply a second bias signal to gate terminals of the second transistor and the fourth transistor,
wherein the first transistor and the third transistor are of a first conductivity type, and wherein the second transistor and the fourth transistor are of a second conductivity type, the second conductivity type being different from the first conductivity type.

9. The buffer circuit of claim 8, wherein a respective resistive element of a predetermined first resistance is coupled between each of:
the drain terminal of the first transistor and the voltage supply input node;
the drain terminal of the second transistor and the reference supply input node;
the drain terminal of the third transistor and the voltage supply input node; and
the drain terminal of the fourth transistor and the reference supply input node.

10. The buffer circuit of claim 8, wherein the CDTA further comprises:
a third path comprising a fifth transistor, a sixth transistor, a seventh transistor and an eighth transistor, wherein a gate terminal of the fifth transistor is coupled to the drain terminal of the first transistor, wherein a gate terminal of the sixth transistor is coupled to the drain terminal of the second transistor, wherein drain terminals of the fifth transistor and sixth transistor are coupled to the first output node of the CDTA, wherein a source terminal of the fifth transistor is coupled to the voltage supply input node, wherein a source terminal of the sixth transistor is coupled to the reference supply input node, wherein a gate terminal of the seventh transistor is coupled to the drain terminal of the third transistor, wherein a gate terminal of the eighth transistor is coupled to the drain terminal of the fourth transistor, wherein drain terminals of the seventh transistor and eighth transistor are coupled to the second output node of the CDTA, wherein a source terminal of the seventh transistor is coupled to the voltage supply input node, wherein a source terminal of the eighth transistor is coupled to the reference supply input node, wherein the sixth transistor and the eighth transistor are of the first conductivity type, and wherein the fifth transistor and the seventh transistor are of the second conductivity type.

11. The buffer circuit of claim 10, wherein a respective resistive element of a predetermined second resistance is coupled between each of:
the voltage supply input node and the source terminals of the fifth transistor and the seventh transistor; and
the reference supply input node and the source terminals of the sixth transistor and the eighth transistor.

12. The buffer circuit of claim 10, wherein the fifth transistor and the sixth transistor are coupled in parallel to the seventh transistor and the eighth transistor.

13. The buffer circuit of claim 8, wherein the biasing circuitry of the CDTA comprises:
a ninth transistor of the first conductivity type; and
a tenth transistor of the second conductivity type,
wherein a gate terminal of the ninth transistor is coupled to the gate terminals of the first transistor and the third transistor,
wherein a gate terminal of the tenth transistor is coupled to the gate terminals of the second transistor and the fourth transistor,
wherein source terminals of the ninth transistor and the tenth transistor are coupled in series,
wherein a drain terminal of the ninth transistor is coupled to the voltage supply input node and the gate terminal of the ninth transistor, and
wherein a drain terminal of the tenth transistor is coupled to the reference supply input node and the gate terminal of the tenth transistor.

14. The buffer circuit of claim 13, wherein a respective resistive element of a predetermined first resistance is coupled between each of:
the drain terminal of the ninth transistor and the voltage supply input node; and
the drain terminal of the tenth transistor and the reference supply input node.

15. The buffer circuit of claim 13, wherein bulk terminals of the first transistor, the third transistor and the ninth transistor are coupled with each other, and wherein the bulk terminals of the first transistor, the third transistor and the ninth transistor are coupled with the source terminal of the ninth transistor.

16. The buffer circuit of claim 13, wherein bulk terminals of the second transistor, the fourth transistor and the tenth transistor are coupled with each other, and wherein the bulk terminals of the second transistor, the fourth transistor and the tenth transistor are coupled with the source terminal of the tenth transistor.

17. The buffer circuit of claim 1, wherein the first source follower circuit comprises:
a voltage supply input node configured to receive a voltage supply signal;
a reference supply input node configured to receive a reference supply signal;
a first path comprising a first transistor and a second transistor coupled in series, wherein a drain terminal of the first transistor is coupled to the voltage supply input node, and wherein a source terminal of the second transistor is coupled to the reference supply input node;
a second path comprising a third transistor and a fourth transistor coupled in series, wherein a source terminal of the third transistor is coupled to the voltage supply input node, and wherein a drain terminal of the fourth transistor is coupled to the reference supply input node;
a third path comprising a fifth transistor and a sixth transistor, wherein source terminals of the fifth transistor and the sixth transistor are coupled to the output node of the first source follower circuit, wherein a drain terminal of the fifth transistor is coupled to the voltage supply input node, wherein a drain terminal of the sixth transistor is coupled to the reference supply input node, wherein a gate terminal of the fifth transistor is coupled to the source terminal of the fourth transistor, wherein a gate terminal of the sixth transistor is coupled to the source terminal of the first transistor; and
biasing circuitry configured to supply a first bias signal to a gate terminal of the third transistor and to supply a second bias signal to a gate terminal of the second transistor,
wherein gate terminals of the first transistor and the fourth transistor are coupled to an input node of the first source follower circuit for receiving the first output signal of the CDTA.

18. The buffer circuit of claim 17, wherein the first transistor, the second transistor and the fifth transistor of the first source follower circuit are of a first conductivity type, and wherein the third transistor, the fourth transistor and the sixth transistor of the first source follower circuit are of a second conductivity type, the second conductivity type being different from the first conductivity type.

19. The buffer circuit of claim 17, wherein the biasing circuitry of the first source follower circuit comprises:
a current source configured to output an adjustable bias current based on a control signal; and
a seventh transistor of the second conductivity type; and
an eighth transistor of the first conductivity type,
wherein drain terminals of the seventh transistor and the eighth transistor are coupled to the current source,
wherein a source terminal of the seventh transistor is coupled to the voltage supply input node,
wherein a source terminal of the eighth transistor is coupled to the reference supply input node,
wherein a gate terminal of the seventh transistor is coupled to the current source and the gate terminal of the third transistor, and
wherein a gate terminal of the eighth transistor is coupled to the current source and the gate terminal of the second transistor.

20. The buffer circuit of claim 1, further comprising a multiplexer circuit configured to:
selectively couple one or more of a plurality of first input nodes of the buffer circuit to the first input node of the CDTA; and
selectively couple one or more of a plurality of second input nodes of the buffer circuit to the second input node of the CDTA.

21. The buffer circuit of claim 20, wherein at least one of the plurality of first input nodes of the buffer circuit is for receiving a first calibration signal, and wherein at least one of the plurality of second input nodes of the buffer circuit is for receiving a second calibration signal, the first and the second calibration signals forming a differential calibration signal pair for circuitry coupled to the first and the second source follower circuits.

22. The buffer circuit of claim 20, wherein at least one of the plurality of first input nodes of the buffer circuit is for receiving a first radio frequency signal, and wherein at least one of the plurality of second input nodes of the buffer circuit is for receiving a second radio frequency signal, the first and the second radio frequency receive signals forming a differential radio frequency signal pair.

23. A receiver, comprising:
a buffer circuit according to claim 1; and
an analog-to-digital converter coupled to the buffer circuit and configured to generate digital output data based on the first and the second buffer output signal.

24. The receiver of claim 23, further comprising:
analog circuitry configured to receive a radio frequency receive signal from an antenna element, wherein the first input node and the second input node of the CDTA are coupled to the analog circuitry.

25. A base station, comprising:
the receiver according to claim 23; and
a transmitter configured to generate a radio frequency transmit signal.

* * * * *